United States Patent [19]
Wu

[11] Patent Number: 5,976,967
[45] Date of Patent: Nov. 2, 1999

[54] DUAL DAMASCENE PROCESS FOR MULTI-LEVEL METALLIZATION AND INTERCONNECTION STRUCTURE

[75] Inventor: Shye-Lin Wu, Hsinchu, Taiwan

[73] Assignee: Texas Instruments - Acer Incorporated, Hsinchu, Taiwan

[21] Appl. No.: 09/023,261

[22] Filed: Feb. 13, 1998

[51] Int. Cl.$^6$ .................... H01L 21/4763; H01L 21/44
[52] U.S. Cl. .................... 438/618; 438/647; 438/648; 438/645; 438/669
[58] Field of Search .................... 438/647, 648, 438/645, 669, 618

[56]   References Cited
    U.S. PATENT DOCUMENTS 5,354,712  10/1994  Ho et al. .
5,358,901  10/1994  Fiordalice et al. .
5,598,027   1/1997  Matsuura .
5,817,572  10/1998  Chiang et al. .
5,891,799   4/1999  Tsui .

OTHER PUBLICATIONS

David Butler "Options for multilevel metallization" in Solid State Technology p. s7, Mar. 1996.
K. Kikuta et al. "Multilevel Planarized–Trench–Aluminum (PTA) Interconnection using Reflow Sputtering and Chemical Mechanical Polishing" (in IEDM Tech. Dig. p. 285, 1993).
R.V. Joshi "A New Damascene Structure for Submicrometer Interconnect Wiring" in IEEE Electron Device Letters, vol. 14, No. 3, 1993.

Primary Examiner—John F. Niebling
Assistant Examiner—Josetta Jones
Attorney, Agent, or Firm—Harness, Dickey & Pierce, P.L.C.

[57]   ABSTRACT

The method of metallization includes the steps as follows. At first, a semiconductor substrate is provided and a dielectric layer is formed over the semiconductor substrate. A portion of the dielectric layer is removed to form contact holes and a first conductive layer is formed within the contact holes and over the dielectric layer. A portion of the first conductive layer is removed to define a contact pattern. Using the first conductive layer as a mask, a portion of the dielectric layer is removed to form openings within the dielectric layer and over the first conductive layer. A second conductive layer is then formed within the openings and over the first conductive layer. To planarize the surface of the semiconductor substrate, a portion of the second conductive layer and the first conductive layer is removed to planarize to the dielectric layer.

18 Claims, 4 Drawing Sheets

DUAL DAMASCENE PROCESS FOR MULTI-LEVEL METALLIZATION AND INTERCONNECTION STRUCTURE

FIELD OF THE INVENTION

The present invention relates to semiconductor fabrication, and more specifically to a method of metallization. A dual damascene process is provided for forming multi-level metallization and interconnection structure.

BACKGROUND OF THE INVENTION

The semiconductor has been developed for four decades from the birth of the first semiconductor device. For performing more complicate operations with higher speed, more and more devices and connections are formed within a circuit. The density of semiconductor chips are raised to include more devices and functions in a single chip. In the integrated circuits, a great number of devices and connections are fabricated on a single chip. Various kinds of devices like transistors, resistors, and capacitors are formed together. Each device must operate with the good connections to provide interaction between each other for completing the functionality, especially under the higher and higher packing density of the integrated circuits.

Connections must be formed in addition to these densely arranged devices for finishing a circuit to perform operations. In the semiconductor manufacturing process, metallization is a process to form connections between devices. With more and more devices on a chip with high integrity, early stage single layer metallization process had been improved to form multiple layer of connections. Two layers, three layers, or even four layers of connections are formed in present applications. With the sub-micrometer or even smaller devices, the metallization process is challenged with forming narrower conductive lines with compromising resistance. More layers of connections must be formed with low misalignment and good yield.

For fabricating high density devices like ULSI (ultra-large scale integration) devices, metallization with small pitch and multilevel-structure become necessary for providing high packing density with reliable functionality. D. Butler disclosed an analysis of several metallization technique in the article "Options for multilevel metallization" in Solid State Technology p. s7, March, 1996. He disclosed that fundamental limitations in the performance of established metallization technologies become increasingly apparent for smaller feature size of the devices. Higher packing density has led to additional levels of metal interconnects. It is possible to use up to four to six levels of interconnects in the design rule for logic devices with 0.35 micrometer feature size. The metallization process need to be improved for providing connections with higher operating speeds, reduced RC delay, and increased reliability. A compare between several metallization technologies including aluminum reflow, tungsten plug, and forcefill aluminum are provided in his work.

In the conventional planarization process for metallization, several problems hindered the application for high integrity circuits. The problems like the interlevel dielectric gap fill and subsequent local or global planarization are difficult to overcome even with the chemical-mechanical polishing (CMP) technology. In the work of K. Kikuta et al. in "Multilevel Planarized-Trench-Aluminum (PTA) interconnection using Reflow Sputtering and Chemical Mechanical Polishing" (in IEDM Tech. Dig. P. 285, 1993), the challenges are addressed. The electrode pitch has become smaller as the packing density of devices increases. Multilevel-metallization has become necessary for densely arranged devices. Dielectric planarization has been developed for high density devices with multilevel interconnection. The conventional planarization problems of interlevel dielectric gap fill and subsequent local or global planarization are also emphasized. A metal planarization for achieving borderless or self-aligned contacts with minimum line pitch is also disclosed in the work.

In recent times, the damascene technology has been reported to achieve the metal planarization with self-aligned contact and the minimum line pitch. A damascene structure to form high-density interconnect wiring is presented by R. V. Joshi in the work "A New Damascene Structure for Submicrometer Interconnect Wiring" in IEEE Electron Device Letters, vol. 14, No. 3, 1993. The structure results in improved short yields, lower sheet resistances, comparable contact/via resistances, and shows excellent filling of high-aspect-ratio long lines with high copper content compared to traditionally used wiring fabricated by reactively ion etching (RIE) of Ti/Al-Cu/Ti/TiN.

However, for the multilevel-metallization, the conventional damascene technology is also difficult to control the pattern misalignment problem. In U.S. Pat. No. 5,598,027 to M. Matsuura of "Semiconductor Device and Method of Fabricating the same", the pattern misregistration in forming a multilayer interconnection structure is illustrated. The problem causes circuit short and element damages and thus yield of the process is reduced. For fabricating integrated circuits with high packing density, a metallization process solving the problem of planarization and misalignment must be developed.

SUMMARY OF THE INVENTION

A process of metallization is disclosed in the present invention. A multilevel metallization and interconnection structure with dual damascene characteristics is formed in the method. The multilevel metal planarization can be achieved. The control of the process to increase accuracy and yield can be enhanced.

The method of metallization in the present invention includes the steps as follows. At first, a semiconductor substrate is provided and a dielectric layer is formed over the semiconductor substrate. A portion of the dielectric layer is removed to form contact holes and a first conductive layer is formed within the contact holes and over the dielectric layer. A portion of the first conductive layer is removed to define a contact pattern. Using the first conductive layer as a mask, a portion of the dielectric layer is removed to form openings within the dielectric layer and over the first conductive layer. A second conductive layer is then formed within the openings and over the first conductive layer. To planarize the surface of the semiconductor substrate, a portion of the second conductive layer and the first conductive layer is removed to planarize to the dielectric layer.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention propose a dual damascene process for multi-level metallization and interconnection structure. The metallization process can be improved with the method disclosed for providing interconnections between devices with less defect. The effect of misalignment can be reduced. The multilevel metal planarization is achieved. The proposed process is more controllable than the conventional damascene during the semiconductor manufacturing process. The method for forming a multilayer connections is described as follows.

Figure 1:
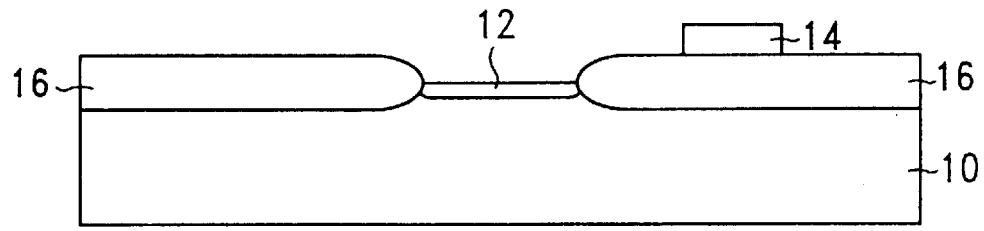
FIG. 1 illustrates a cross sectional view of forming a semiconductor substrate in the present invention.

Referring to FIG. 1, a cross sectional view of a semiconductor 10 is illustrated. The semiconductor substrate 10 had been finished with the forming of operational devices like transistors, resistors, and capaticors. The cross sectional view illustrates only the junction region 12 and a conductor line 14 cross over the isolation region 16. The whole structure of transistors is not shown with the cross section. Without limiting the scope of the invention, the cross section is illustrated only for introducing the metallization method in the present invention.

Figure 2:
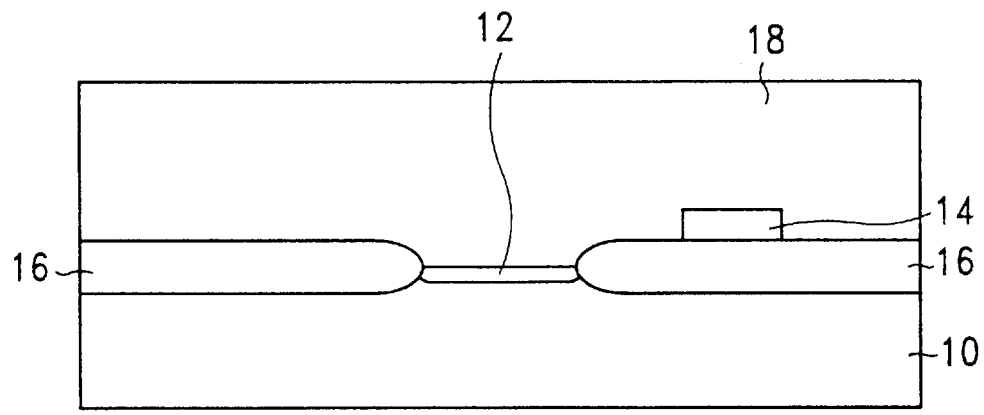
FIG. 2 illustrates a cross sectional view of forming a dielectric layer on the semiconductor substrate in the present invention.

Referring to FIG. 2, a dielectric layer 18 is then formed over the semiconductor substrate 10. The dielectric layer 18 is formed by a chemical vapor deposition (CVD) process. The dielectric layer 18 is used to provide individual contact paths to independent junctions, gates, or pads and form effective insulation between each path. A variety choices in the dielectric materials like oxide or nitride can be used. The oxide like a TEOS-oxide (tetra-ethyl-ortho-silicate oxide) can be used. Other dielectric materials like BPSG (borophosphosilicate glass), PSG (phosphosilicate Glass), BSG (borosilicate glass), and etc. can also be used alternatively.

Figure 3:
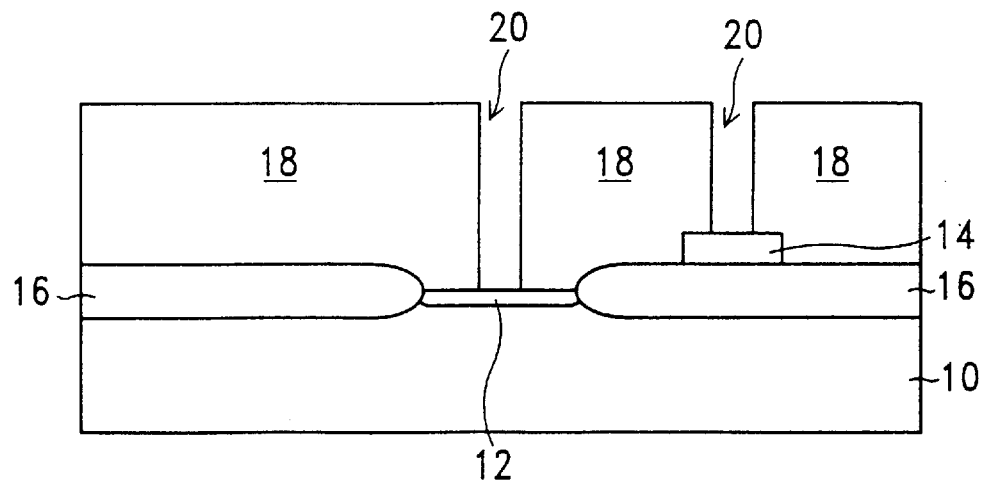
FIG. 3 illustrates a cross sectional view of removing a portion of the dielectric layer to form contact holes in the present invention.

A portion of the dielectric layer 18 is removed to form contact holes 20, as shown in FIG. 3. A lithography process is used to define the regions to form connections to the independent regions, conductors, or pads on the semiconductor substrate 10. An etching process, especially the dry etching process like a reactive ion etching (RIE) can be used to etch the dielectric layer 18 with defined pattern. The contact holes 20 are etched to the depth of forming paths for conductive connections to the junction 12 and conducting line 14.

Figure 4:
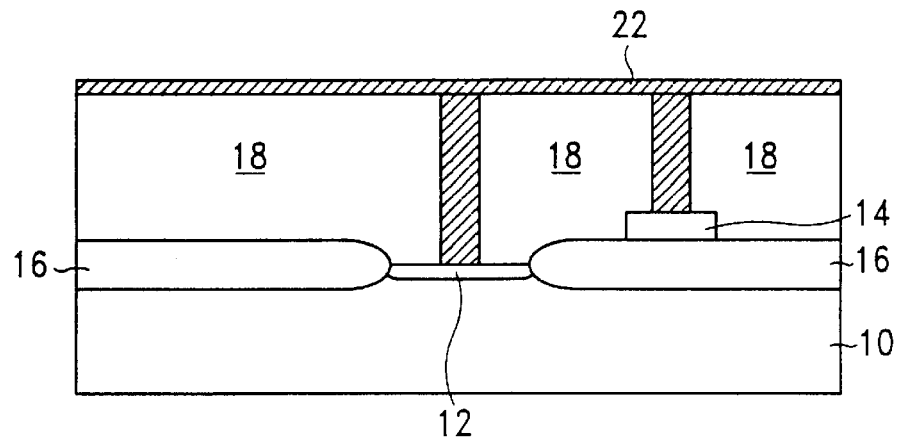
FIG. 4 illustrates a cross sectional view of forming a first conductive layer within the contact holes and over the dielectric layer in the present invention.

Followed with the formation of the contact holes 20, a first conductive layer 22 are formed within the contact holes 20 and over the dielectric layer 18, as shown in FIG. 4. Lots of conductive materials can be used for the first conductive layer 22. In present semiconductor manufacturing process, materials like tungsten, tungsten silicide, aluminum, and doped polysilicon can be used. The method of forming the first conductive layer 22 like sputtering or chemical vapor deposition can be employed for different materials. The formation of the first conductive layer 22 provided conductive paths to the junction 12 and conducting line 14.

Figure 5:
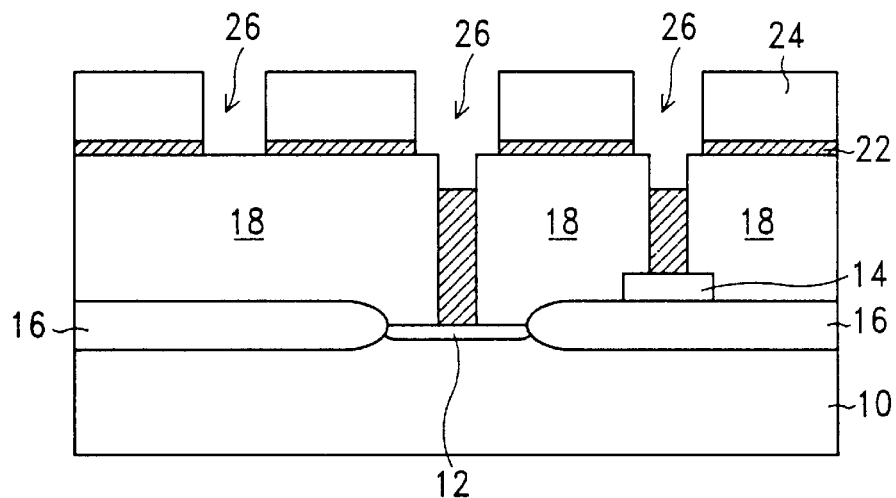
FIG. 5 illustrates a cross sectional view of removing a portion of the first conductive layer to define a contact pattern in the present invention.

Referring to FIG. 5, a portion of the first conductive layer 22 is then removed to define a contact pattern 24. The contact pattern 26 is defined with the region to form the designed connections between the independent paths formed by the first conductive layer 22 in the contact holes 20. In general, the definition of the contact pattern 26 can be achieved by a lithography process and an etching process. A photoresist layer 24 can be formed over the first conductive layer 22 to be exposed with a designed pattern on a photo mask. The etching process like a reactive ion etching is followed to form the contact pattern 26 and the photoresist layer 24 is then removed. The etching process are performed to etch the first conductive layer 22 to the depth deeper than the top surface of the dielectric layer 18. Thus the contact pattern 26 can provide spaces in the dielectric layer 18 for the forming of a second conductive layer within by a process which will be performed later. The width of the contact pattern 26 can be defined wider than the conductive paths formed by the first conductive layer 22. With wider contact pattern 26 for forming conductive layer later, the tolerance to misalignment can be raised and the resistance of the connections can be reduced.

Figure 6A:
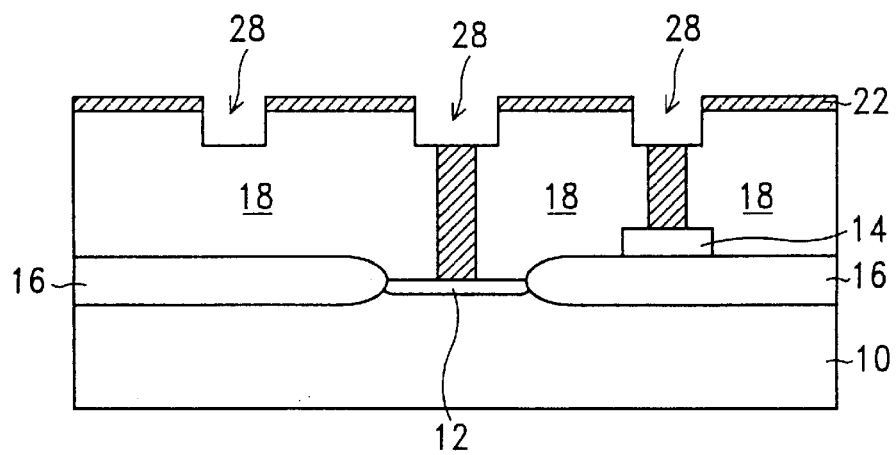
FIG. 6a illustrates a cross sectional view of removing a portion of the dielectric layer to form openings within the dielectric layer by the contact pattern in the present invention.
Figure 6B:
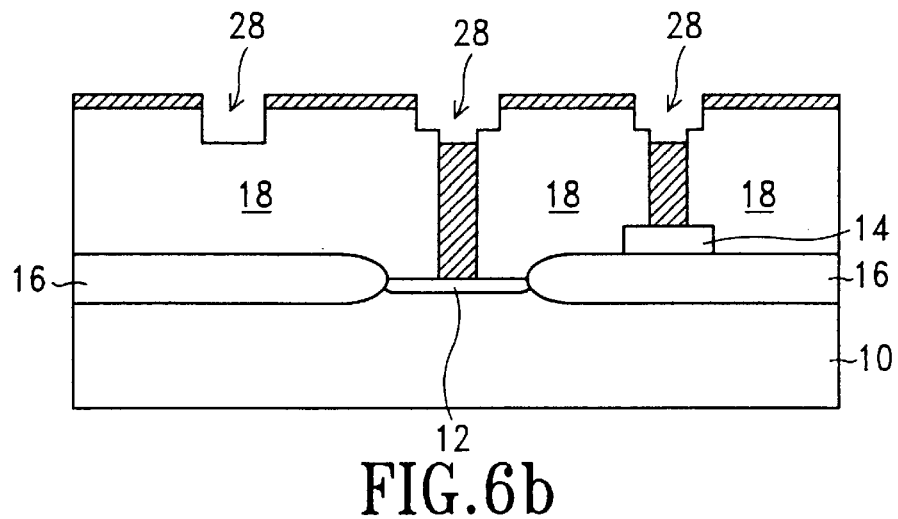
FIG. 6b illustrates a cross sectional view of under etching a portion of the dielectric layer to form openings within the dielectric layer and over the first conductive layer in the present invention.
Figure 6C:
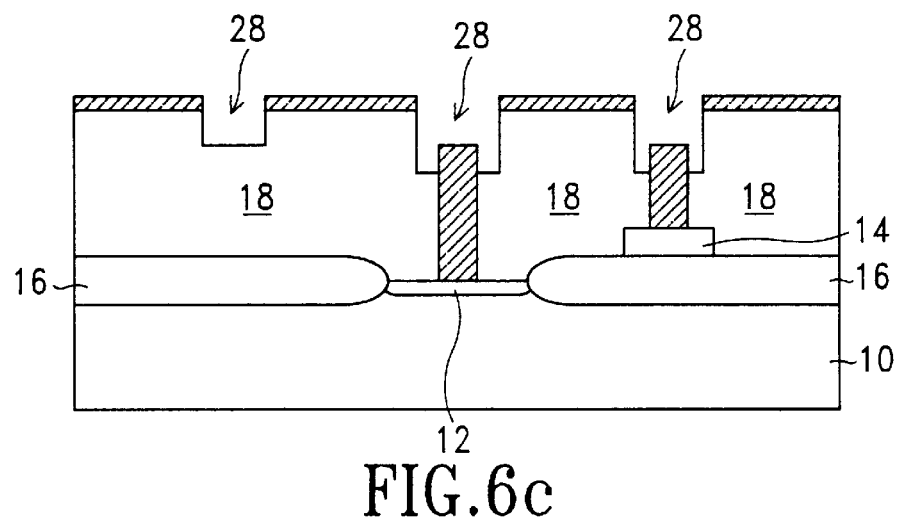
FIG. 6c illustrates a cross sectional view of over etching a portion of the dielectric layer to form openings within the dielectric layer and over the first conductive layer in the present invention.

A portion of the dielectric layer 18 is removed using the first conductive layer 22 as a mask as shown in FIG. 6a. Openings 28 are formed within the dielectric layer 18 and over the first conductive layer. Since the first conductive layer 22 acts as a mask in forming a damascene structure, the accompanying disadvantages of using conventional lithography process can be greatly reduced. Conventional lithography process needed for forming the structure is eliminated and the efforts and cost can be reduced. The removing of a portion of the dielectric layer 18 can be performed with a reactive ion etching process. The etching can be performed to the depth near the height of the top surface of the first conductive layer 22 in the dielectric layer 18. The tolerance in the etching depth is high. The under etching as shown in FIG. 6b or the over etching as shown in FIG. 6c are all acceptable cases without infulences on the functionality of the integrated circuits. Thus the etching process can be easily controlled under the large process window of the etching depth.

Figure 7:
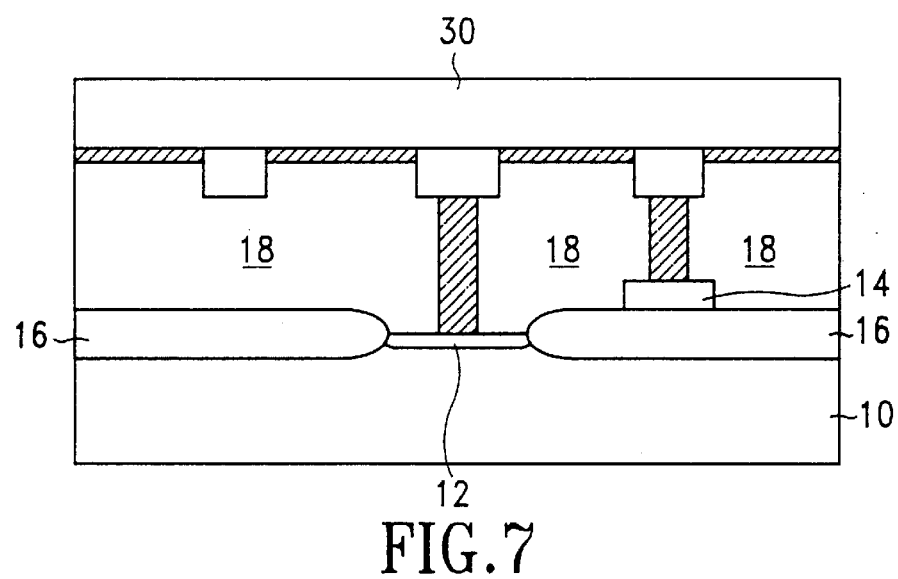
FIG. 7 illustrates a cross sectional view of forming a second conductive layer within the openings and over the first conductive layer in the present invention.
Figure 8:
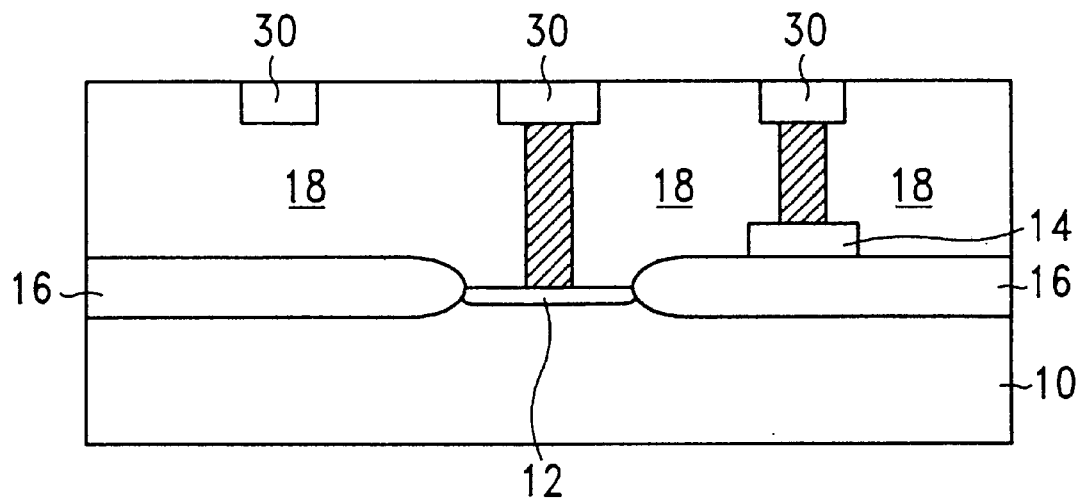
FIG. 8 illustrates a cross sectional view of removing a portion of the second conductive layer and the first conductive layer to planarize to the dielectric layer in the present invention.

Referring to FIG. 7, a second conductive layer 30 is then formed within the openings 28 and over the first conductive layer 22 to make connections between the paths. The second conductive layer 30 can be materials like tungsten, tungsten silicide, titanium silicide, aluminum, and etc. The formation method like sputtering or chemical vapor deposition can be employed for different materials. A portion of the second conductive layer 30 and of the first conductive layer 22 is removed to planarize to the dielectric layer 18, as shown in FIG. 8. The process can be performed with a planarization process like a chemical mechanical polishing to have a planar top surface of the dielectric layer 18. Thus more metallization process can be formed for finishing the whole chip connection with multilayer structure.

Figure 9:
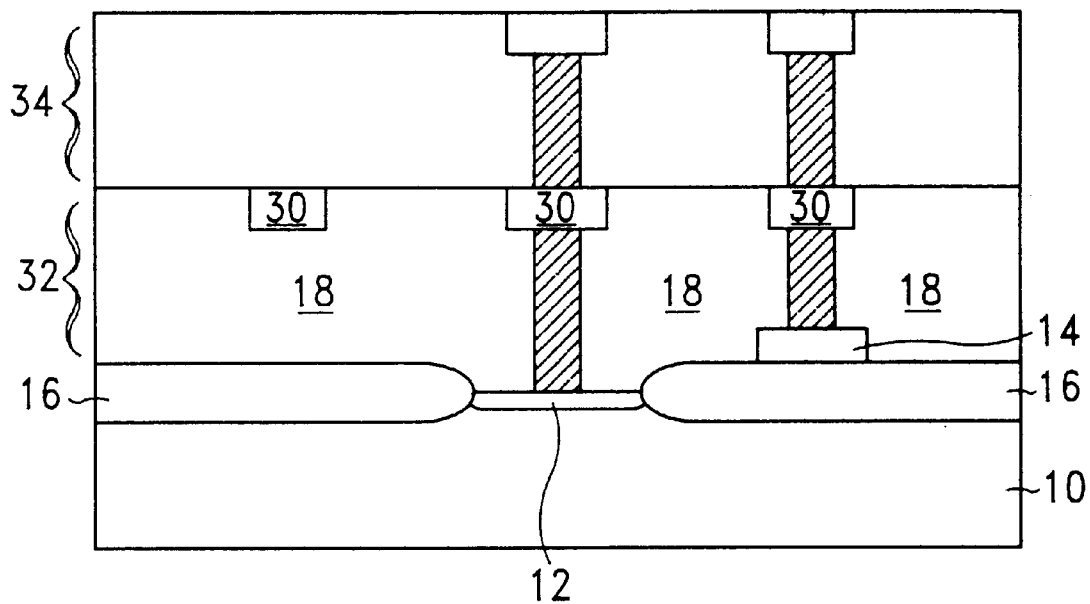
FIG. 9 illustrates a cross sectional view of the semiconductor with another metallization process in the present invention performed.

After the first layer of interconnection structure 32 is formed, the same serious steps as described above can be performed to form a second layer of interconnection structure 34, as shown in FIG. 9. With the aforementioned process, more connecting layers can be formed to create a multilayer connections structure with up to six or more layers.

The dual damascene process in present invention forms multilevel metallization and interconnection structure. The process of forming dual damascene structure is greatly simplified by defining the contact pattern 26 on the first conductive layer 22 and using it as a hard mask for etching the openings 28. Thus the conventional process of using a photoresist layer or a buffer layer can be replaced. The alignment problem can be solved. As mentioned above, the tolerance to misalignment is raised by the process in the present invention. The process window to the etching process is increased and thus the process can be well controlled. The proposed process is more controllable than the conventional damascene technology. The multilevel metal planarization could be achieved at the same time.

With the method and the structure of the present invention, the disadvantages of using photoresist or dielectric material for forming the damascene structure can be reduced. The residue problem of the photoresist or the dielectric are often encountered with the conventional method. Morever, the problems are enhanced especially for smaller contact holes or contacts holes with high aspect ratio. The photoresist or the dielectric residues in small or high aspect ratio contact holes are hard to clean entirely and the selectivity problem during the removing must also be considered. The present invention is free of the residue problem. Thus the yield and the throughput of the semiconductor fabrication process are raised.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of metallization, said method comprising the steps of:
    providing a semiconductor substrate;
    forming a dielectric layer over said semiconductor substrate;
    removing a portion of said dielectric layer to form contact holes;
    forming a first conductive layer within said contact holes and over said dielectric layer;
    removing a portion of said first conductive layer to define a contact pattern;
    removing a portion of said dielectric layer for forming openings within said dielectric layer by said contact pattern;
    forming a second conductive layer within said openings and over said first conductive layer; and
    removing a portion of said second conductive layer and said first conductive layer to planarize to said dielectric layer.

2. The method of claim 1, wherein said dielectric layer is formed by chemical vapor deposition, and said dielectric layer being selected from the group consisting of TEOS-oxide (tetra-ethyl-ortho-silicate oxide), BPSG (borophosphosilicate glass), PSG (phosphosilicate Glass), BSG (borosilicate glass), and silicon nitride.

3. The method of claim 1, wherein said step of removing a portion of said dielectric layer is performed with a reactive ion etching (RIE) process to form said contact holes.

4. The method of claim 1, wherein said first conductive layer is selected from the group consisting of tungsten, tungsten silicide, aluminum, and doped polysilicon.

5. The method of claim 1, wherein said step of removing a portion of said first conductive layer is performed with a reactive ion etching (RIE) process to form said contact pattern.

6. The method of claim 1, wherein said step of removing a portion of said first conductive layer is performed to remove said first conductive layer in said contact holes to be lower than top surface of said dielectric layer.

7. The method of claim 1, wherein said step of removing a portion of said dielectric layer using said first conductive layer as a mask is performed with a reactive ion etching (RIE) process to form said openings.

8. The method of claim 1, wherein said second conductive layer is selected from the group consisting of tungsten, tungsten silicide, titanium silicide, and aluminum.

9. The method of claim 1, wherein said step of removing a portion of said second conductive layer and said first conductive layer is performed by a planarization process.

10. The method of claim 1, wherein said planarization process comprises a chemical-mechanical polishing (CMP) process to planarize to said dielectric layer.

11. A method of metallization, said method comprising the steps of:
    providing a semiconductor substrate;
    forming a dielectric layer over said semiconductor substrate;
    etching a portion of said dielectric layer to form contact holes;
    forming a first conductive layer within said contact holes and over said dielectric layer;
    etching a portion of said first conductive layer to define a contact pattern, said first conductive layer being etched to be lower than top surface of said dielectric layer;
    etching a portion of said dielectric layer for forming openings within said dielectric layer by said contact pattern;
    forming a second conductive layer within said openings and over said first conductive layer; and
    performing a planarization process to said semiconductor substrate to remove a portion of said second conductive layer and said first conductive layer to planarize to said dielectric layer.

12. The method of claim 11, wherein said dielectric layer is formed by chemical vapor deposition, and said dielectric layer being selected from the group consisting of TEOS-oxide (tetra-ethyl-ortho-silicate oxide), BPSG (borophosphosilicate glass), PSG (phosphosilicate Glass), BSG (borosilicate glass), and silicon nitride.

13. The method of claim 11, wherein said step of etching a portion of said dielectric layer is performed with a reactive ion etching (RIE) process to form said contact holes.

14. The method of claim 1, wherein said first conductive layer is selected from the group consisting of tungsten, tungsten silicide, aluminum, and doped polysilicon.

15. The method of claim 11, wherein said step of etching a portion of said first conductive layer is performed with a reactive ion etching (RIE) process to form said contact pattern.

16. The method of claim 11, wherein said step of etching a portion of said dielectric layer using said first conductive layer as a mask is performed with a reactive ion etching (RIE) process to form said openings.

17. The method of claim 11, wherein said second conductive layer is selected from the group consisting of tungsten, tungsten silicide, titanium silicide, and aluminum.

18. The method of claim 11, wherein said planarization process comprises a chemical-mechanical polishing (CMP) process to planarize to said dielectric layer.

* * * * *